United States Patent [19]

Teller, Jr.

[11] 4,361,910

[45] Nov. 30, 1982

[54] GROUND LOOP INJECTION VHF TUNER

[76] Inventor: Howard S. Teller, Jr., c/o Robert E. Browne, Ste. 4410, 135 S. LaSalle St., Chicago, Ill. 60603

[21] Appl. No.: 273,481

[22] Filed: Jun. 15, 1981

[51] Int. Cl.$^3$ .............................................. H04B 1/26
[52] U.S. Cl. .................................................... 455/320
[58] Field of Search .............................. 455/371–320, 455/302, 311

[56] References Cited

U.S. PATENT DOCUMENTS

| | | | |
|---|---|---|---|
| 1,647,609 | 11/1927 | Cotter | 455/320 |
| 2,457,008 | 12/1948 | Sziklai | 455/320 |
| 2,811,636 | 10/1957 | Achenbach | 455/319 |
| 3,063,011 | 11/1962 | Sproul et al. | 455/320 |

Primary Examiner—Marc E. Bookbinder
Attorney, Agent, or Firm—Leo J. Aubel; Robert E. Browne

[57] ABSTRACT

A VHF tuner circuit comprising an oscillator for generating a harmonic which is close to the RF frequency, including resonant circuit means for providing a low impedance path for coupling the desired harmonic current to the mixer and for providing a high impedance path for all the other harmonics, thereby suppressing the reception of spurious signals.

6 Claims, 2 Drawing Figures

GROUND LOOP INJECTION VHF TUNER

BACKGROUND OF THE INVENTION

A VHF tuner having a conventional diode mixer circuit 11 is shown in FIG. 1, wherein a crystal oscillator circuit 12 feeds a multiplier diode 14 load from the emitter of transistor 16. By driving the multiplier diode 14 heavily in the forward direction, the non-linear properties of the diode cause heavy harmonic generation. A parallel resonant circuit 18, comprised of inductor 19 and capacitor 21 which are tuned to the desired harmonic, causes a chosen harmonic to be injected into the input of the mixer transistor 20 through a coupling capacitor 22. Such multiplier diode harmonic generators constitute inherently low impedance sources, as seen from the parallel resonant circuit 18, with the result that the Q of the resonant system is quite low, typically resulting in poor selectivity characteristics with respect to the chosen harmonic to be injected into the mixer transistor 20. Thus, for example, harmonics well below or well above the desired injection frequencies will also be present at the input of mixer transistor 20 and can result in image reception from unwanted stations. Accordingly, it is desirable to inject to the input of the mixer 20 a specifically selected harmonic from the crystal oscillator circuit 12, without the presence of other such undesired harmonics.

In a VHF tuner circuit, an improved circuit for injection of a desired harmonic of the oscillator frequency into the mixer stage and suppressing all other harmonics.

BRIEF DESCRIPTION OF THE DRAWING

The foregoing features and advantages of the present invention will be apparent from the following more particular description of the invention. The accompanying drawings, listed hereinbelow, are useful in explaining the invention wherein.

DESCRIPTION OF INVENTION

Figure 1:
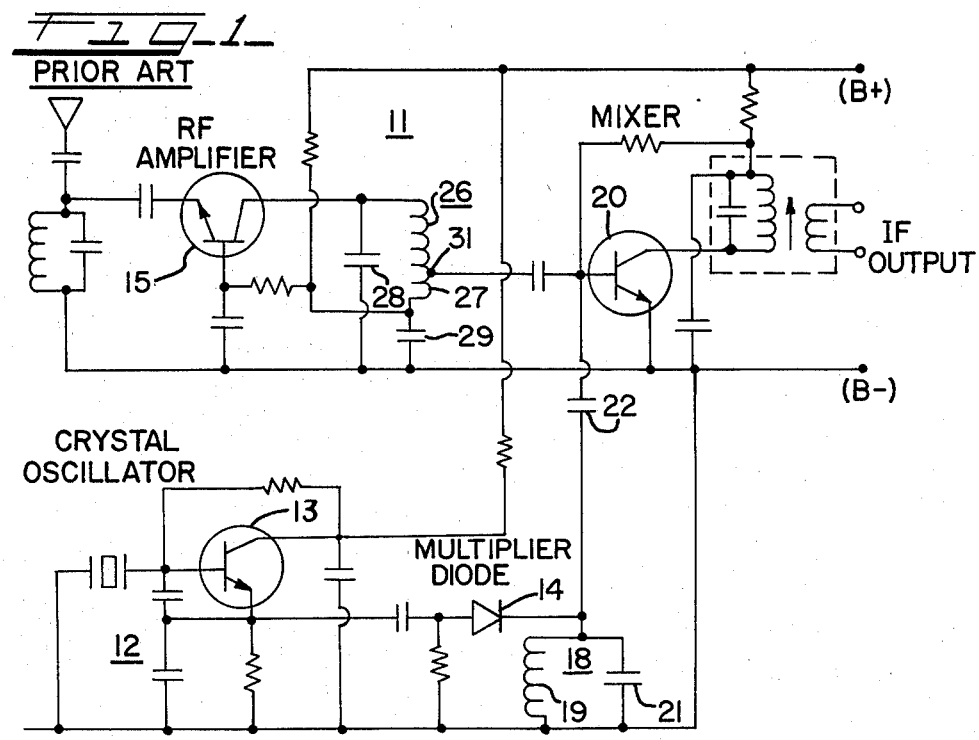
FIG. 1 is a diagram of a prior art circuit for injecting the harmonic of the oscillator frequency to the mixer stage.
Figure 2:
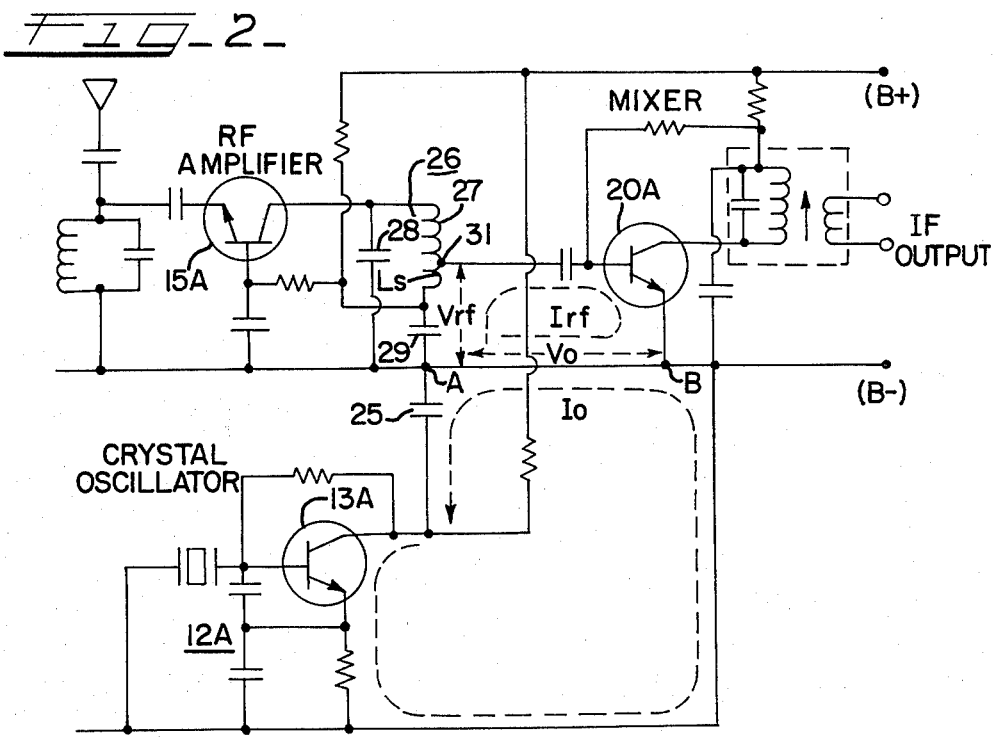
FIG. 2 is a diagram of the present invention, showing the improved circuitry and means for providing or injecting the harmonic of the oscillator frequency to the mixer stage of the VHF tuner.

FIG. 2 shows an improved oscillator coupling circuit for providing high selectivity of the chosen harmonic to be delivered to the mixer 20A of a VHF tuner. Basically, FIG. 2 shows a direct improvement over the prior art circuit of FIG. 1. FIG. 2 is generally similar to the prior art circuit of FIG. 1, with certain very important exceptions, as will be described hereinbelow. Certain components of FIG. 2 carry the same reference numerals as in FIG. 1 and indicate similar components.

In the circuit of FIG. 2, a crystal oscillator circuit, generally designated as 12A, which is designed to be rich in harmonics, generates an output signal at the collector or transistor amplifier 13A. This signal may, for example, include, predominantly, the tenth harmonic of 16.202 MHz. The output of amplifier 13A is coupled, through a coupling capacitor 25, to the resonant circuit 26 of the RF amplifier, as will be explained. Note that, in FIG. 2, the multiplier diode 14 and its resonant circuit 18 have been completely eliminated; and the frequency of oscillator 12A is chosen such that a desired selected harmonic of the oscillator 12A output will beat with the incoming signal frequency (the output of RF amplifier 15A), which is typically in the 160 MHz range, to produce at the mixer 20A output an IF output frequency in the very low MHz or fractional MHz range (typically 0.456 MHz). Under such conditions, it is possible to use a portion, labeled $L_s$, of the radio frequency amplifier output resonant circuit inductor 27 as part of a series resonant circuit 26 to select the desired harmonic.

The output oscillator circuit 12A is coupled to the mixer 20A through the impedance of a common ground bus between points A and B of FIG. 2. The radio frequency portion of the oscillator transistor amplifier 13A collector current $I_o$ will thus circulate from collector of transistor 13A through coupling capacitor 25 through the common bus connection between points B and A, and back to the emitter of transistor amplifier 13A. Since even a small length of bus between points A and B has significant impedance at high frequency, the potential between points A and B varies in time to replicate the harmonic-rich waveform. The common bus between the points A and B also serves as part of the base to emitter current loop of the mixer 20A when driven by the RF amplifier 15A. Hence, any voltage developed between the common bus points A and B will reflect as a drive current to the mixer 20A; and, thus, the harmonic output of the crystal oscillator 12A becomes added to the output of the RF amplifier 15A at the input of the mixer 20A. To achieve the desired selectivity, i.e., to reject all but a chosen harmonic received from the crystal oscillator 12A for presentation at the input of the mixer 20A, the portion $L_s$ of inductor 27 in the resonant circuit 26 is arranged to provide a series resonance between point a and the mixer base input so as to present a low impedance-high drive condition with respect to the chosen harmonic, e.g., the tenth harmonic of the crystal oscillator 12A, and to present a high impedance-low drive configuration for all other harmonics of the oscillator.

To this end, the bypass capacitor 29, returning the lower end of the amplifier inductor 27 to point A, is chosen such that, in combination with that portion $L_s$ of inductor 27 below the output tap 31, as shown in FIG. 2, it constitutes a series resonant circuit at the chosen harmonic frequency. Since the inductance of $L_s$ is substantially smaller than the inductance of the whole coil 27, capacitance 29 may be considerably larger than capacitance 28 and achieve this condition. Coupling capacitor 25 is chosen to be sufficiently large that it has no effect on the resonance condition. Moreover, capacitance 29 is also sufficiently large that only a minor adjustment of capacitance 28 is necessary to preserve the proepr parallel resonance condition presented to the RF amplifier transistor 15A to preserve proper signal tuning for the input signal from the antenna. Thus, proper amplification selectivity is maintained from the RF amplifier 15A to the mixer 20A; and, at the same time, a high selectivity series resonant circuit is obtained for passage of the harmonic signal from point A to the mixer input 20A, thereby providing a well-filtered tenth harmonic of the crystal oscillator 12A frequency for mixing purposes.

As indicated by the dotted arrowed lines in FIG. 2, as the oscillator current $I_o$ flows through the ground bus from points B to A, a voltage $V_o$ is generated (the ground pattern is not a zero resistance at the RF and oscillator frequency of 162 MHz). Therefore, $V_{RF}$ arithmetically combines with $V_o$; also, current $I_{RF}$ and current $I_o$ add as these currents flow from points B to A. $V_{RF}$ is the voltage generated by current $I_{RF}$.

Thus, in addition to providing an improvement in the operation of the prior art circuit, the present invention provides the improvement with fewer components. It has been found that the invention provides an average improvement of 30 times in spurious rejection of unwanted FM station signals.

While the invention has been particularly shown and described with reference to a preferred embodiment thereof, it will be understood by those skilled in the art that various changes in form and details may be made therein without departing from the spirit and scope of the invention.

I claim:

1. An improved circuit for providing a predetermined harmonic injection current derived from an oscillator frequency signal to an RF frequency mixer and for suppressing all other harmonics, wherein said mixer receives said predetermined harmonic and an RF signal as outputs of a tuned circuit including an inductance and capacitance, said improved circuit comprising an oscillator providing a harmonic-rich signal current including a predetermined harmonic for injecting into said mixer, which predetermined harmonic is relatively close in frequency to the input RF frequency, and a first capacitor and a portion of the inductance of said tuned circuit connected as a series circuit coupled to said oscillator and having a low series impedance for the predetermined harmonic injection current and a high series impedance to other harmonics.

2. A circuit as in claim 1, wherein said mixer comprises a transistor amplifier having base, emitter and collector electrodes, said oscillator includes an output transistor amplifier having base, emitter and collector electrodes, a coupling capacitor connecting the collector electrode of said oscillator to said first capacitor, a bus connecting the emitter of said mixer to said first capacitor, said oscillator amplifier providing said harmonic-rich signal current in a path through said bus, the base to emitter current of said mixer also flowing through said bus wherein the injection currents in said bus arithmetically combine.

3. A circuit as in claim 1, wherein an RF voltage coupled from said tuned circuit to said mixer is arithmetically combined in said tuned circuit with a voltage corresponding to said predetermined harmonic injection current.

4. A circuit as in claim 1, wherein said first capacitor and said portion of the inductance comprise a single path to the mixer for said injection current.

5. A circuit as in claim 1, wherein the frequency of said predetermined harmonic and the RF frequency are relatively close.

6. A circuit as in claim 1, wherein said tuned circuit is fed from an RF amplifier coupled to an associated antenna and wherein the first capacitor is sufficiently large that the proper parallel resonance condition is presented to the RF signal amplifier to preserve proper signal tuning for the signal from the antenna with only minor adjustment of said tuned circuit capacitance.

* * * * *